United States Patent
Pelham et al.

(10) Patent No.: US 7,211,478 B1
(45) Date of Patent: May 1, 2007

(54) DIAGONAL DEEP WELL REGION FOR ROUTING BODY-BIAS VOLTAGE FOR MOSFETS IN SURFACE WELL REGIONS

(75) Inventors: Mike Pelham, Sunnyvale, CA (US); James B. Burr, Foster City, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 11/199,896

(22) Filed: Aug. 8, 2005

Related U.S. Application Data

(63) Continuation of application No. 10/334,272, filed on Dec. 31, 2002, now Pat. No. 6,936,898.

(51) Int. Cl.
  *H01L 29/76* (2006.01)
  *H01L 29/94* (2006.01)
  *H01L 31/062* (2006.01)
  *H01L 21/8234* (2006.01)
  *H01L 21/337* (2006.01)
  *H01L 31/119* (2006.01)

(52) U.S. Cl. .................. 438/197; 438/201; 257/371

(58) Field of Classification Search ........ 438/197–228; 257/368–379
See application file for complete search history.

(56) References Cited

U.S. PATENT DOCUMENTS

| | | | |
|---|---|---|---|
| 5,447,876 A | 9/1995 | Moyer et al. | 437/41 |
| 6,048,746 A | 4/2000 | Burr | 438/17 |
| 6,087,892 A | 7/2000 | Burr | 327/534 |
| 6,091,283 A | 7/2000 | Murgula et al. | 327/537 |
| 6,169,310 B1 | 1/2001 | Kalnitsky et al. | 257/355 |
| 6,218,708 B1 | 4/2001 | Burr | 257/372 |
| 6,218,895 B1* | 4/2001 | De et al. | 257/371 |
| 6,303,444 B1 | 10/2001 | Burr | 438/289 |
| 6,489,224 B1 | 12/2002 | Burr | 438/526 |
| 6,617,656 B2 | 9/2003 | Lee et al. | 257/401 |
| 6,677,643 B2 | 1/2004 | Iwamoto et al. | 257/341 |
| 6,936,898 B2* | 8/2005 | Pelham et al. | 257/371 |
| 2001/0028577 A1 | 10/2001 | Sung et al. | 365/185.18 |
| 2006/0102958 A1* | 5/2006 | Masleid | 438/197 |

FOREIGN PATENT DOCUMENTS

EP 0624909 A3 11/1994

\* cited by examiner

*Primary Examiner*—Cuong Nguyen

(57) ABSTRACT

Diagonal deep well region for routing the body-bias voltage for MOSFETS in surface well regions is provided and described.

20 Claims, 4 Drawing Sheets

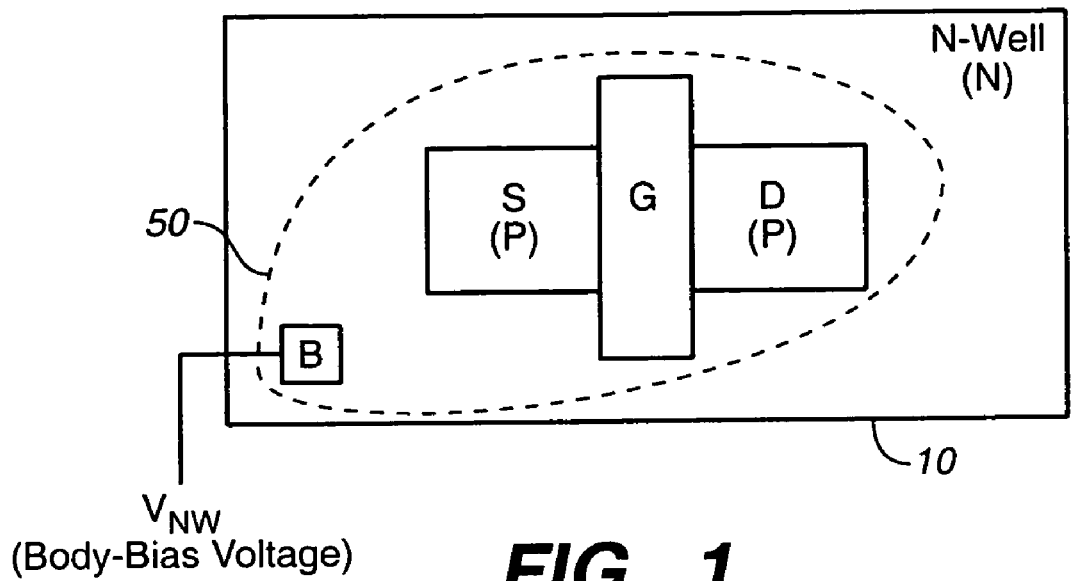
FIG._1
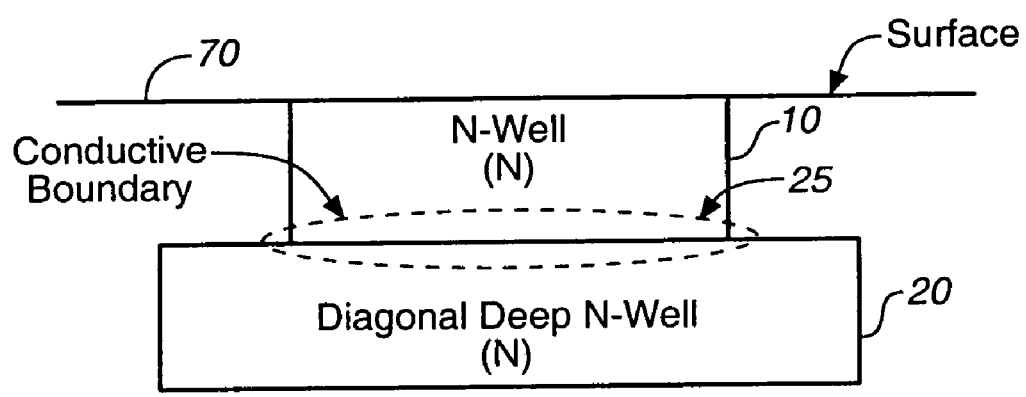
FIG._2

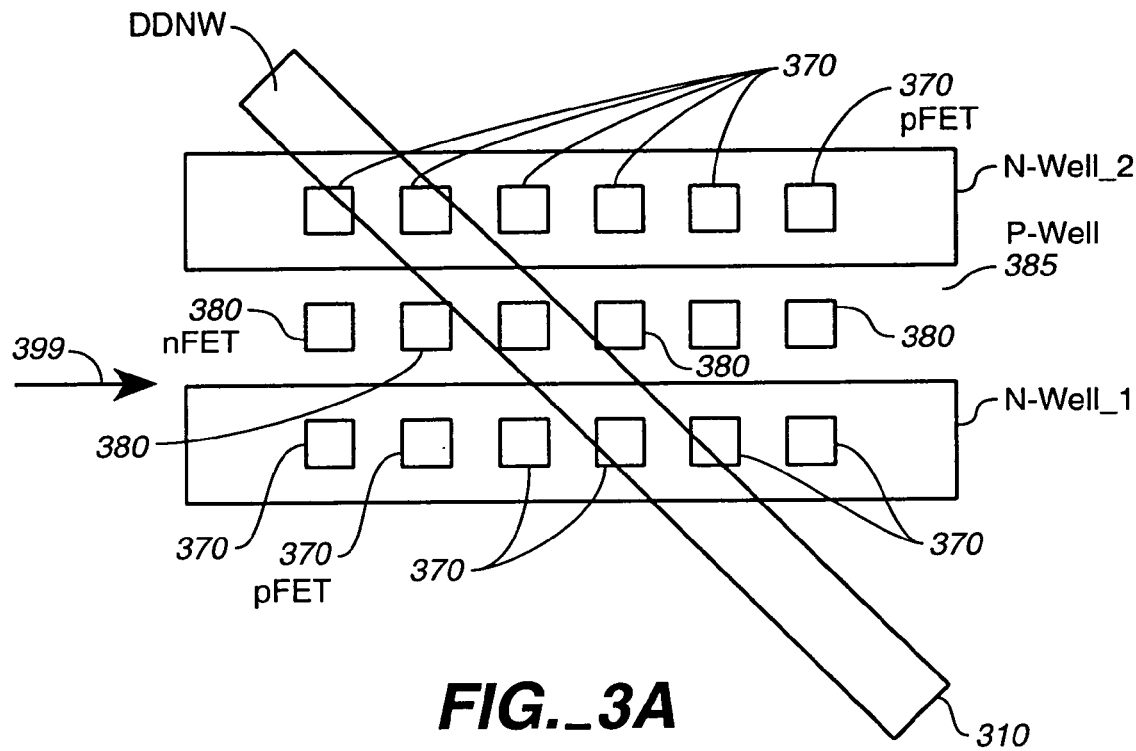
FIG._3A
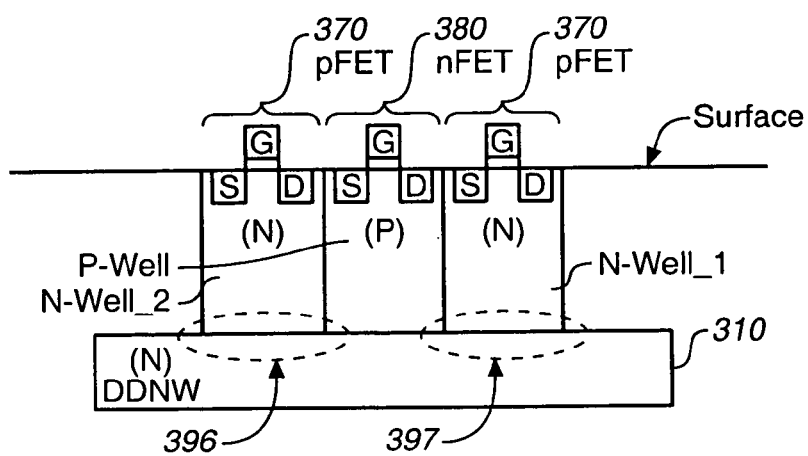
FIG._3B

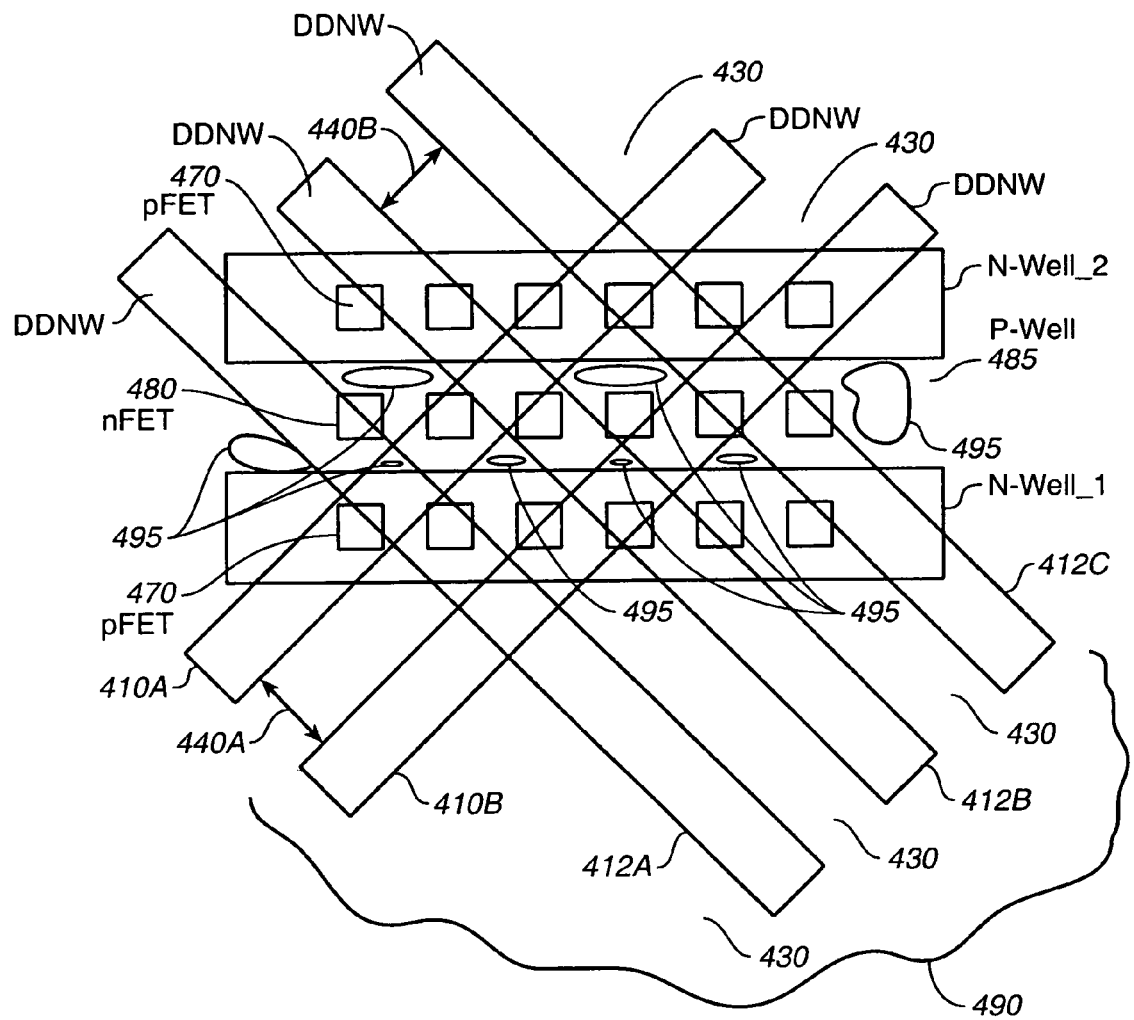
FIG._4

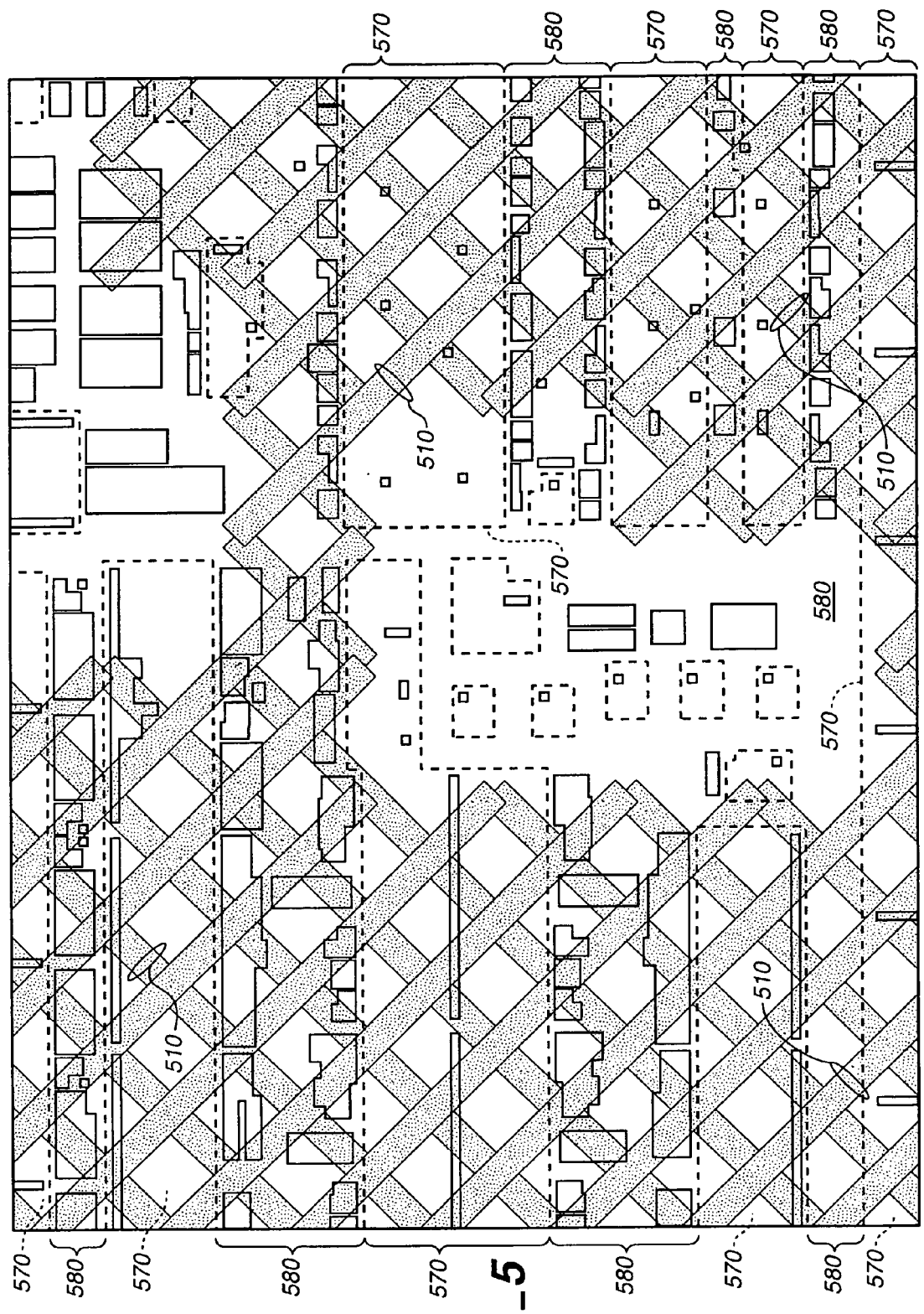
FIG._5

US 7,211,478 B1

DIAGONAL DEEP WELL REGION FOR ROUTING BODY-BIAS VOLTAGE FOR MOSFETS IN SURFACE WELL REGIONS

This patent application is a Continuation of commonly-owned patent application Ser. No. 10/334,272, filed on Dec. 31, 2002, now U.S. Pat. No. 6,936,898 entitled "DIAGONAL DEEP WELL REGION FOR ROUTING BODY-BIAS VOLTAGE FOR MOSFETS IN SURFACE WELL REGIONS", by Pelham et al., which is incorporated herein by reference.

BACKGROUND OF THE INVENTION

1. Field of the Invention

The present invention generally relates to MOSFETS (metal oxide semiconductor field effect transistors). More particularly, the present invention relates to the field of routing body-bias voltage to the MOSFETS.

2. Related Art

Generation of the physical layout of a semiconductor device having MOSFETS (metal oxide semiconductor field effect transistors) formed on a semiconductor substrate is a challenging task. An extensive amount of time and resources are spent during the creation of the physical layout. However, consumption of resources can be minimized if new physical layouts utilize substantial potions of existing physical layouts. For example, a new physical layout having MOSFETS that are body-biased would be less expensive to generate if an existing physical layout having MOSFETS without body-bias is utilized and modified according to the needs of the new physical design. Unfortunately, this process of modifying the existing physical layout typically requires forming an additional routing layer for the body-bias voltage on the surface of the semiconductor device, creating a serious issue since the existing physical layout utilizes most, if not all, available surface area.

SUMMARY OF THE INVENTION

Diagonal deep well region for routing the body-bias voltage for MOSFETS in surface well regions is provided and described.

BRIEF DESCRIPTION OF THE DRAWINGS

The accompanying drawings, which are incorporated in and form a part of this specification, illustrate embodiments of the invention and, together with the description, serve to explain the principles of the present invention.

FIG. 1 illustrates a top view of a pFET formed in an N-well in accordance with an embodiment of the present invention, showing the pFET having a body-bias voltage Vnw applied to its bulk/body B terminal.

FIG. 2 illustrates the relative positioning of an N-well and a diagonal deep N-well region beneath a surface of a semiconductor device in accordance with an embodiment of the present invention.

FIG. 3A illustrates a top view of multiple N-wells and a diagonal deep N-well (DDNW) region in accordance with an embodiment of the present invention.

FIG. 3B illustrates a side view of FIG. 3A along arrow 399 in accordance with an embodiment of the present invention.

FIG. 4 illustrates a top view of multiple N-wells and multiple diagonal deep N-well (DDNW) regions forming a mesh structure in accordance with an embodiment of the present invention.

FIG. 5 illustrates a physical layout having multiple N-wells and multiple diagonal deep N-well (DDNW) regions forming a mesh structure in accordance with an embodiment of the present invention.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details.

Although the following description of the present invention will focus on routing a body-bias voltage to pFETS (or p-type MOSFETS) formed in surface N-wells via a conductive sub-surface region of N-type doping when a p-type substrate and an N-well process are utilized, the present invention is equally applicable to routing a body-bias voltage to nFETS (or n-type MOSFETS) formed in surface P-wells via a conductive sub-surface region of P-type doping when an n-type substrate and a P-well process are utilized.

FIG. 1 illustrates a top view of a pFET 50 (or p-type MOSFET) formed in an N-well 10 when a p-type substrate and an N-well process are utilized in accordance with an embodiment of the present invention, whereas the pFET 50 has a body-bias voltage Vnw applied to its bulk/body B terminal. As depicted in FIG. 1, the pFET 50 has gate G, drain D (p-type doping), source S (p-type doping), and bulk/body B terminals. In particular, the bulk/body B terminal is coupled to the N-well 10. Hence, a voltage applied to the bulk/body B terminal is received by the N-well 10. The N-well has an n-type doping. Regions of a semiconductor device that are doped with an n-type dopant have one type of conductivity while regions that are doped with a p-type dopant have another type of conductivity. Typically, various dopant concentrations are utilized in different regions of the semiconductor device.

The pFET 50 is body-biased to influence its performance. Without body-biasing, the source S and bulk/body B terminals are coupled together. With body-biasing, the source S and bulk/body B terminals are not coupled together. Body-biasing enables controlling the potential difference between the source S and bulk/body B terminals of the pFET 50, providing the ability to electrically tune the threshold voltage level of the pFET 50.

In the case of body-biasing, the bulk/body B terminal receives a body-bias voltage Vnw. As described above, the bulk/body B terminal represents a connection to the N-well 10. Thus, the body-bias voltage Vnw is applied to the N-well 10.

Rather than generating an entire new physical layout for a semiconductor device to support the pFET 50 having the body-bias voltage Vnw, an existing physical layout can be modified. In particular, the existing physical layout is modified by including a diagonal deep N-well region to route the body-bias voltage Vnw to the N-wells 10, whereas the diagonal deep N-well represents a conductive sub-surface well layer that is beneath the N-well. This avoids the need to create another surface routing layer on a surface of the semiconductor device that does not have much free surface area for additional routing.

In particular, the body-bias voltage Vnw is routed to the N-wells in one or more diagonal deep N-well regions (which are conductive sub-surface well layers) as opposed to surface metal layers. The advantage of this approach is that while typically there is little or no room on the densely packed surface area of the semiconductor device for extra metal routing layers, the area beneath the surface of the semiconductor device is often underutilized due to the fact that routing signals through wells is generally prohibited by the poor frequency response and potentially high resistance of the wells. In the present invention, rather than carrying signals, the diagonal deep N-well regions serve to hold and distribute the body-bias voltage Vnw.

FIG. 2 illustrates the relative positioning of an N-well 10 (also known as a surface N-well) and a diagonal deep N-well region 20 beneath a surface 70 of a semiconductor device in accordance with an embodiment of the present invention. The N-well 10 is formed beneath the surface 70 of the semiconductor device and has an N-type doping. The diagonal deep N-well region 20 is formed beneath the N-well 10 such that the diagonal deep N-well region 20 and the N-well 10 share a sub-surface conductive boundary 25 that allows the diagonal deep N-well region 20 to function like a conductive sub-surface routing layer for routing the body-bias voltage Vnw to the N-wells. That is, the diagonal deep N-well region 20 contacts the N-well 10 along the sub-surface conductive boundary 25. Moreover, the diagonal deep N-well region 20 is buried under the surface 70 of the semiconductor device. The diagonal deep N-well region 20 has an n-type doping. It should be understood that if an n-type substrate and a P-well process were utilized, a diagonal deep well of P-type doping would be utilized to function as a conductive sub-surface routing layer for routing the body-bias voltage to the surface P-wells.

The dimensions and size of the sub-surface conductive boundary 25 determine the resistance of the conductive path between the N-well 10 and the diagonal deep N-well region 20. As the size of the sub-surface conductive boundary 25 is increased, the resistance of the sub-surface conductive path between the N-well 10 and the diagonal deep N-well region 20 is lowered to create a low-resistance conductive path.

A top view of multiple N-wells (e.g., N-well_1 and the N-well_2) and a diagonal deep N-well (DDNW) region 310 in accordance with an embodiment of the present invention is illustrated in FIG. 3A. Rather than being a continuous planar layer, the diagonal deep N-well (DDNW) region 310 is a patterned layer. As depicted in FIG. 3A, the diagonal deep N-well region 310 has a strip shape and is beneath the N-well_1 and the N-well_2 of a semiconductor device. The diagonal deep N-well region 310, the N-well_1, and the N-well_2 have an N-type doping. Moreover, the orientation of the diagonal deep N-well region 310 is diagonal or slanted with respect to the N-well_1 and the N-well_2. In an embodiment, the diagonal deep N-well region 310 forms an angle that is approximately 45 degrees with the N-well (e.g., N-well_1 or the N-well_2).

It should be understood that the diagonal deep N-well region 310 can have other configurations and that multiple diagonal deep N-well regions can be patterned into various arrangements. For example, additional diagonal deep N-well regions can be positioned in parallel with the diagonal deep N-well region 310 at positions spaced apart from the diagonal deep N-well region 310. Also, a rotated version of the diagonal deep N-well region 310 can be created by rotating the orientation by approximately 90 degrees. Moreover, the diagonal deep N-well region 310 and the rotated version can be arranged as an X-pattern (or crisscross pattern) beneath the N-well_1 and the N-well_2.

The diagonal deep N-well region 310 routes the body-bias voltage Vnw to the N-well_1 and the N-well_2 so that the pFETs 370 can be body-biased. Thus, a contact for the body-bias voltage Vnw can be formed wherever there is free surface area, such as above the N-well_1, the N-well_2, or diagonal deep N-well region 310. Additionally, the diagonal deep N-well region 310 enables the nFETS (n-type MOSFETS) 380 to be body-biased in any manner by preventing isolation of a p-type region or p-well region 385 on which the nFETS 380 are formed. Thus, the diagonal deep N-well region 310 allows the formation of conductive paths between the p-well region 385 and a sub-surface layer that is formed beneath the diagonal deep N-well region 310. Moreover, the location and size of the diagonal deep N-well region 310 is based on the distribution of the N-wells and the p-type regions or P-wells, whereas the goal is to provide low resistance conductive paths. However, the dimensions and size of the diagonal deep N-well region 310 should avoid isolating the p-type regions or P-wells from sub-surface layers that are formed beneath the diagonal deep N-well region 310.

FIG. 3B illustrates a side view of FIG. 3A along arrow 399 in accordance with an embodiment of the present invention. As illustrated in FIG. 3B, there is a first sub-surface conductive boundary 396 between the N-well_1 and the diagonal deep N-well region 310. Moreover, there is a second sub-surface conductive boundary 397 between the N-well_2 and the diagonal deep N-well region 310. The body-bias voltage Vnw is routed to the N-well_1 and the N-well_2 via the first and second sub-surface conductive boundaries 396 and 397.

FIG. 4 illustrates a top view of multiple N-wells (e.g., N-well_1 and the N-well_2) and multiple diagonal deep N-well (DDNW) regions forming a mesh structure in accordance with an embodiment of the present invention. Here, the diagonal deep N-well regions 410A and 410B are orthogonal to the diagonal deep N-well regions 412A, 412B, and 412C. Thus, the diagonal deep N-well regions 412A, 412B, 412C, 410A, and 410B form a sub-surface mesh structure 490 for routing the body-bias voltage Vnw to the N-well_1 and the N-well_2 so that the pFETs 470 can be body-biased.

The orientation of the mesh structure 490 is diagonal with respect to the orientation of the N-well_1 and the N-well_2. In an embodiment, the mesh structure 490 is rotated approximately 45 degrees with respect to the N-wells (e.g., N-well_1 and the N-well_2). Each diagonal deep N-well region 412A, 412B, 412C, 410A, and 410B has a strip shape, has an N-type doping, and is beneath the N-well_1 and the N-well_2 of the semiconductor device. It should be understood that the mesh structure 490 can have other configurations. For example, the gaps 440A and 440B between adjacent diagonal deep N-well regions can vary in size. Moreover, the ratio of diagonal deep N-well regions to gap area 430 can vary.

Additionally, the mesh structure 490 enables the nFETS (n-type MOSFETS) 480 to be body-biased in any manner by preventing isolation of a p-type region or P-well region 485 on which the nFETS 480 are formed. The regions 495 between diagonal deep N-well regions prevent isolation of the P-well region 485 and enable a conductive path between the P-well region 485 and a sub-surface layer that is beneath the diagonal deep N-well regions 412A, 412B, 412C, 410A, and 410B. In an embodiment, the area of the mesh structure 490 is equally divided between diagonal deep N-well regions and gap area 430.

As discussed above, a contact for the body-bias voltage Vnw can be formed wherever there is free space, such as above the N-well_1, the N-well_2, or diagonal deep N-well regions 412A, 412B, 412C, 410A, and 410B. Moreover, the location and size of the mesh structure 490 is based on the distribution of the N-wells and the P-type regions or P-wells, whereas the goal is to provide low resistance conductive paths.

However, the size of the mesh structure 490 should avoid isolating the P-type regions or P-wells 485 from sub-surface layers that are formed beneath the diagonal deep N-well regions. Moreover, the gap area 430 is sized so that to provide a low-resistance conductive path between the P-type regions or P-wells 485 and a sub-surface layer that is formed beneath the diagonal deep N-well regions, whereas the greater the gap area 430 the lower the resistance of this conductive path. Additionally, lateral diffusion and lateral depletion can further reduce the gap area 430, potentially pinching-off this conductive path between the P-type regions or P-wells 485 and a sub-surface layer that is formed beneath the diagonal deep N-well regions. As a solution to this situation, the gaps 440A and 440B between adjacent diagonal deep N-well regions are made sufficiently wide to avoid pinching-off this conductive path between the P-type regions or P-wells 485 and a sub-surface layer that is formed beneath the diagonal deep N-well regions. Yet, as the number and size of the diagonal deep N-well regions are increased, the resistance of the conductive path for routing the body-bias voltage Vnw is decreased because there are larger and more sub-surface conductive boundaries between the N-well regions and the diagonal deep N-well regions. Hence, there is a trade-off between the gap area 430 and the diagonal deep N-well regions in each design situation.

FIG. 5 illustrates a physical layout having multiple N-wells and multiple diagonal deep N-well (DDNW) regions 510 forming a mesh structure in accordance with an embodiment of the present invention. As described above, the multiple diagonal deep N-well (DDNW) regions 510 form a sub-surface mesh structure that routes the body-bias voltage Vnw to the N-wells 570 without isolating the P-type regions or P-wells 580 from sub-surface layers that are beneath the diagonal deep N-well regions 510.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of routing a body-bias voltage to surface wells of a first conductivity in a semiconductor device, said method comprising:
    forming a sub-surface mesh structure of said first conductivity below a surface of said semiconductor device and below said surface wells, wherein said sub-surface mesh structure is oriented diagonally with respect to an orientation of said surface wells;
    electrically coupling said sub-surface mesh structure to said surface wells to create a conductive path; and
    applying said body-bias voltage to said sub-surface mesh structure.

2. The method as recited in claim 1 wherein said sub-surface mesh structure has an N-type doping.

3. The method as recited in claim 2 wherein said surface wells have an N-type doping.

4. The method as recited in claim 3 wherein each surface well includes a p-type MOSFET (metal oxide semiconductor field effect transistor).

5. The method as recited in claim 1 wherein said sub-surface mesh structure has a P-type doping.

6. The method as recited in claim 5 wherein said surface wells have a P-type doping.

7. The method as recited in claim 6 wherein each surface well includes an n-type MOSFET (metal oxide semiconductor field effect transistor).

8. A method of routing a body-bias voltage to surface wells of a first conductivity in a semiconductor device, said method comprising:
    forming a plurality of parallel sub-surface regions of said first conductivity below a surface of said semiconductor device and below said surface wells, wherein each parallel sub-surface region is oriented diagonally with respect to an orientation of said surface wells;
    electrically coupling said parallel sub-surface regions to said surface wells to create a conductive path; and
    applying said body-bias voltage to at least one of said parallel sub-surface regions.

9. The method as recited in claim 8 wherein each parallel sub-surface region has an N-type doping.

10. The method as recited in claim 9 wherein said surface wells have an N-type doping.

11. The method as recited in claim 10 wherein each surface well includes a p-type MOSFET (metal oxide semiconductor field effect transistor).

12. The method as recited in claim 8 wherein each parallel sub-surface region has a P-type doping.

13. The method as recited in claim 12 wherein said surface wells have a P-type doping.

14. The method as recited in claim 13 wherein each surface well includes an n-type MOSFET (metal oxide semiconductor field effect transistor).

15. A method of routing a body-bias voltage to first surface wells of a first conductivity in a semiconductor device, said method comprising:
    forming a sub-surface region of said first conductivity below a surface of said semiconductor device, below said first surface wells, and below second surface wells of a second conductivity, wherein said sub-surface region is oriented diagonally with respect to an orientation of said surface wells without isolating said second surface wells;
    electrically coupling said sub-surface region to said surface wells to create a conductive path; and
    applying said body-bias voltage to said sub-surface region.

16. The method as recited in claim 15 wherein said sub-surface region has an N-type doping.

17. The method as recited in claim 16 wherein said first surface wells have an N-type doping and wherein said second surface wells have a P-type doping.

18. The method as recited in claim 17 wherein each first surface well includes a p-type MOSFET (metal oxide semiconductor field effect transistor).

19. The method as recited in claim 15 wherein said sub-surface region has a P-type doping.

20. The method as recited in claim 19 wherein said first surface wells have a P-type doping, wherein said second surface wells have an N-type doping, and wherein each first surface well includes an n-type MOSFET (metal oxide semiconductor field effect transistor).

* * * * *